US010366937B2

(12) United States Patent
Smit et al.

(10) Patent No.: US 10,366,937 B2
(45) Date of Patent: Jul. 30, 2019

(54) COOLING DEVICE, METHOD FOR PRODUCING A COOLING DEVICE AND POWER CIRCUIT

(71) Applicant: CONTINENTAL AUTOMOTIVE GMBH, Hannover (DE)

(72) Inventors: Arnoud Smit, Neuses / Erlangen (DE); Thomas Schmid, Regensburg (DE); Lars Keller, Aiterhofen (DE); Soeren Rittstieg, Neutraubling (DE)

(73) Assignee: CPT Group GmbH, Hannover (DE)

( * ) Notice: Subject to any disclaimer, the term of this patent is extended or adjusted under 35 U.S.C. 154(b) by 0 days.

(21) Appl. No.: 15/911,810

(22) Filed: Mar. 5, 2018

(65) Prior Publication Data

US 2018/0197806 A1 Jul. 12, 2018

Related U.S. Application Data

(63) Continuation of application No. PCT/EP2016/068861, filed on Aug. 8, 2016.

(30) Foreign Application Priority Data

Sep. 3, 2015 (DE) .................... 10 2015 216 887

(51) Int. Cl.
*H05K 7/20* (2006.01)
*H01L 23/373* (2006.01)
(Continued)

(52) U.S. Cl.
CPC ........ *H01L 23/3735* (2013.01); *F28F 21/084* (2013.01); *F28F 21/087* (2013.01);
(Continued)

(58) Field of Classification Search
CPC ... H01L 23/373; H01L 23/3735; H05K 7/209; H05K 1/0209; F28F 21/084; F28F 21/087; F28F 3/12
See application file for complete search history.

(56) References Cited

U.S. PATENT DOCUMENTS

2005/0022978 A1* 2/2005 Duval ................. F28D 15/0233
165/104.26

FOREIGN PATENT DOCUMENTS

DE 10340837 A1 5/2004
DE 102005034998 2/2007
(Continued)

OTHER PUBLICATIONS

International Search Report and Written Opinion dated Oct. 21, 2016 from corresponding International Patent Application No. PCT/EP2016/068861.
(Continued)

*Primary Examiner* — Ermias T Woldegeorgis

(57) ABSTRACT

A cooling device includes an aluminum heat sink and at least one nickel sheet segment. The nickel sheet segment is connected to the aluminum heat sink by a solder layer. The cooling device includes a securing surface for securing and for heat absorption. The securing surface being formed by that side of the nickel sheet segment which faces away from aluminum heat sink. The aluminum heat sink is formed from a plurality of aluminum sheets which are stacked one above another and are connected to one another. At least one aluminum sheet includes cutouts which form a cooling channel covered by at least one of the aluminum sheets. Furthermore, a method for producing a cooling device and also a power circuit comprising a heat sink as described here are presented.

7 Claims, 1 Drawing Sheet

(51) Int. Cl.
  *H05K 1/02*  (2006.01)
  *H01L 23/473*  (2006.01)
  *F28F 21/08*  (2006.01)
  *F28F 13/00*  (2006.01)
(52) U.S. Cl.
  CPC ........ *H01L 23/3736* (2013.01); *H01L 23/473* (2013.01); *H05K 1/0209* (2013.01); *F28F 2013/006* (2013.01); *H05K 1/0203* (2013.01)

(56) References Cited

FOREIGN PATENT DOCUMENTS

| DE | 102009022877 A1 | 11/2010 |
|---|---|---|
| DE | 202011000448 U1 | 6/2011 |
| DE | 102013208350 A1 | 11/2013 |
| DE | 102012107570 A1 | 2/2014 |
| DE | 102014213490 A1 | 1/2016 |
| EP | 1696526 A1 | 8/2006 |
| WO | 2016005065 A1 | 1/2016 |

OTHER PUBLICATIONS

German Office Action dated Jun. 30, 2016 for corresponding German Patent Application No. 10 2015 216 887.5.

* cited by examiner

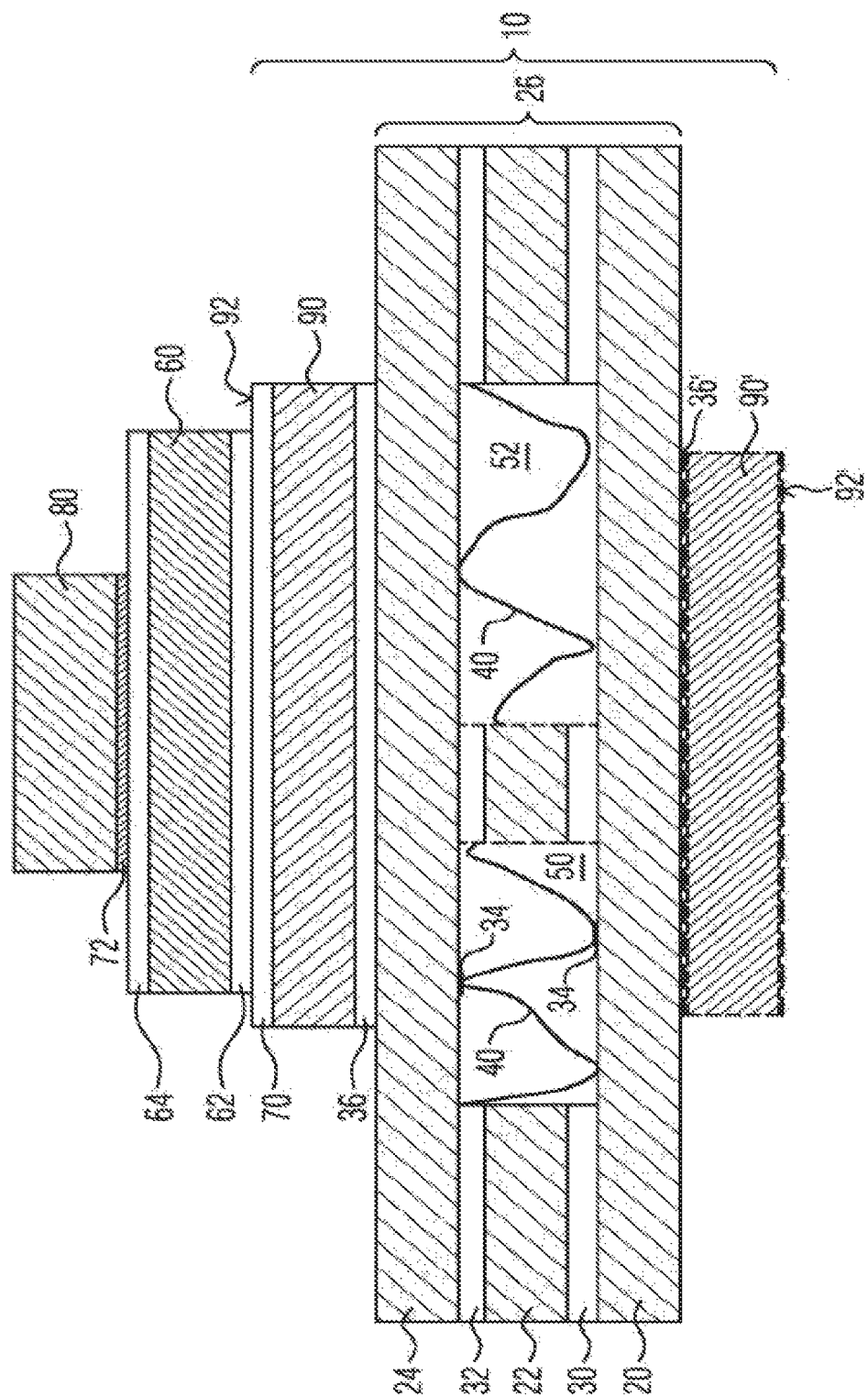

COOLING DEVICE, METHOD FOR PRODUCING A COOLING DEVICE AND POWER CIRCUIT

CROSS-REFERENCE TO RELATED APPLICATIONS

This application claims the benefit of PCT Application PCT/EP2016/068861, filed Aug. 8, 2016, which claims priority to German Application DE 10 2015 216 887.5, Sep. 3, 2015. The disclosures of the above applications are incorporated herein by reference.

TECHNICAL FIELD

The disclosure relates to a cooling device, a method for producing the cooling device and a power circuit equipped with a cooling device.

BACKGROUND

Particularly in automotive applications, electrical or electronic circuits or power semiconductors or other electronic or electrical components are used, the heat loss of which has to be dissipated by heat sinks during operation. Usually, the heat sinks are composed of aluminum because of its good heat conduction properties, while the circuit is formed by a copper-based circuit board or comparable carriers. In order to ensure a good heat dissipation, cooling channels are provided in the aluminum heat sinks. However, the production of the cooling channels in the aluminum heat sink is associated with complexity, while extrusion methods for forming the cooling channels require an aluminum composition, the soldering behavior of which is not optimal.

It is therefore an object of the disclosure to provide a possibility that enables cooled circuits to be produced in a simple manner.

SUMMARY

It has been recognized that aluminum heat sinks can be produced in a simple manner and using conventional means by way of a layered construction. As a result, aluminum sheets having an arbitrary composition may be used. The cooling channels may be created very expediently and precisely by stamping or milling. The stack construction enables simple production by alternately at least one aluminum sheet having cutouts (produced for instance by stamping) and aluminum sheets without cutouts being stacked and being connected to one another. The aluminum sheets may be connected by a soldering process in which, for example, further components such as a copper sheet or a carrier having a copper surface are connected to the aluminum sheet (via a nickel layer), while the aluminum sheets are simultaneously interconnected. With a soldering compound applied before stacking, these connections may be produced by, for example, the soldering compound being melted in a furnace.

Equally, that side of the sheet segment which faces away from the heat sink offers good soldering properties for the mounting of copper, for example, by the nickel layer or, generally, by a solder mediation layer. Therefore, a transition between different materials (copper and aluminum) is also made possible by the solder mediation layer, which is formed, for example, as a nickel or nickel alloy layer.

Therefore, a cooling device that includes an aluminum heat sink and at least one solder mediation layer is provided.

The cooling device is configured for mounting onto a circuit, for example, onto a copper layer of a circuit construction. In this case, the solder mediation layer forms the (planar) heat transfer interface in the form of a securing surface, on which the copper layer is secured. The at least one solder mediation layer is secured or applied cohesively and, in some examples, directly on the aluminum heat sink. The at least one solder mediation layer is applied by vapor deposition or by electrodeposition, for example, on the aluminum heat sink.

Furthermore, the solder mediation layer may be present as a film which is secured by a solder layer. The latter directly connects the solder mediation layer to the aluminum heat sink. In some examples, the solder layer is a hard solder layer.

In some implementations, the cooling device includes a securing surface for securing and for heat absorption. The securing surface may have the function of a heat transfer interface. The securing surface may be formed by a side of the solder mediation layer. The side faces away from the aluminum heat sink (and thus also from the solder layer between sheet segment and heat sink). The side is substantially plane, but can also be adapted to the course of the circuit board to be fitted. The thickness of the solder mediation layer may be substantially (i.e. with a tolerance of not more than +/−10% or +/−5%) identical at every point of the layer.

In some implementations, one or a plurality of solder mediation layers are secured to the heat sink. A plurality of solder mediation layers may be arranged on the surface of the heat sink directly or at a lateral distance from one another. A plurality of solder mediation layers may be provided on the same side, on different sides or on opposite sides of the heat sink. For example, in each case one solder mediation layer or in each case a plurality of solder mediation layers can be secured on (two) opposite sides (preferably parallel to one another) of the heat sink. As already noted, the at least one solder mediation layer is cohesively secured on the heat sink, for example, by a cohesive connection such as by vapor deposition or electrodeposition. In some examples, the heat sink is provided with at least one solder mediation layer on both sides, in order to be able to fit circuit boards or circuits on both sides.

In some examples, the heat sink is flat and preferably substantially parallelepipedal. The heat sink may include cooling fingers in order to dissipate heat at the outer side of the heat sink and at the cooling fingers to a surrounding thermal medium (air). The heat sink includes at least one cooling channel which extends through the heat sink in order to dissipate heat to a thermal medium (liquid, such as, oil or water) that flows through the cooling channel.

The aluminum heat sink is formed from a plurality of aluminum sheets. The latter are stacked one above another. Furthermore, the latter are interconnected, for example, by a solder layer, such as, a hard solder layer. At least one aluminum sheet includes cutouts. The at least one aluminum sheet which has cutouts is covered on both sides by two more of the aluminum sheets or is covered by the aluminum sheet on one side and by the sheet segment on the other side. The cutouts form a cooling channel. In some examples, the cutouts extend through the entire thickness of the aluminum sheet, while in other examples, the cutout extends through part of the entire thickness of the relevant aluminum sheet. The cutout may be in the form of a groove. The cutout leads as far as the edge of the aluminum sheet. The cutout may have a meandering longitudinal course, where the longitudinal course of the cutout extends in one and, in some examples, two different longitudinal extension directions of the aluminum sheet. In some examples, the cutouts extend in a planar fashion. The cutouts may be formed in one or two directions in accordance with a grid. The cutouts are for example stamped or milled or else cast. The aluminum sheets are connected to one another by solder layers, for example. The solder layers seal the aluminum sheets with respect to one another.

Some other sealing element (a layer of sealing, elastic material such as silicone, for instance) can also be provided between the aluminum sheets, where the aluminum sheets are connected to one another by securing elements, for example, a screw connection extending through the aluminum sheets. One of the aluminum sheets (for example, an outer and/or an inner aluminum sheet) may additionally include planar or rod-shaped cooling fins, which may project into the cooling channel. A configuration including rod-shaped cooling fins is also referred to as a "pin fin" structure, where the cooling fins are distributed in a planar fashion (and, for example, uniformly). The cooling fins extend in the interior of the aluminum heat sink, i.e. into the at least one cooling channel, and can thus also be regarded (from a functional standpoint) as turbulators.

In some implementations, the aluminum sheets are rolled aluminum sheets. The latter are solderable by hard solder. The heat sink and the aluminum sheets may have a melting point of at least 590° C., where aluminum with a proportion by mass of silicon of 8-15% is used as hard solder (for connecting the aluminum sheets and/or for securing the nickel sheet segment, i.e. as a solder layer). The hard solder may have a casting temperature of 670-740° C. and a solidification interval of 570-590° C. AlSi12, for example, can be used as hard solder. All Al alloys having a proportion by mass of silicon of 7-13% are suitable as hard solder. Moreover, the melting interval of the hard solder can be 575° C.-615° C.

In some examples, the heat sink and the aluminum sheets have a magnesium proportion of less than 2% by mass, as a result of which a good wettability (with solder material) is achieved. The heat sink and the aluminum sheets may include a proportion by mass of at least 70% aluminum in order to ensure the corrosion resistance. Rolled (or else cast) aluminum sheets may be used, inter alia also AlMg5Si2Mn. In this case, the lower limit for melting of the aluminum sheets is 594° C., for example. If the aluminum body is not formed as an aluminum sheet stack, it may be composed of the material of which the aluminum sheets mentioned here are composed. The indications above therefore relate equally to aluminum sheets and aluminum heat sinks.

The terms "aluminum sheets" and "aluminum heat sinks" exhibit the word constituent "aluminum", thereby indicating that the constituent is predominantly aluminum. Therefore, the use of the word constituent "aluminum" does not indicate an aluminum proportion of 100% (proportion by mass), rather an alloy predominantly consisting of aluminum may be involved, where, as mentioned, additives are not excluded.

The at least one solder mediation layer can be a nickel layer, for example. The at least one nickel layer may have a proportion by mass of nickel of at least 70%, 85% or else at least 95%, 98% or 99% nickel. The thermal conductivity of the solder mediation layer may be at least 70, 75 and in some examples, at least 85 or 90 W/m*K. The solder mediation layer, if it is present as a soldered film, may include a hard solder layer on one side (directed toward the aluminum heat sink) or on both sides before it is connected to the aluminum heat sink or to the relevant aluminum sheet. The solder mediation layer, if formed as a film, may include a hard solder layer directed toward the aluminum heat sink and a soft solder layer on the opposite side. This solder mediation layer provided with at least one solder layer (or a corresponding soldering compound) in this way is stacked and soldered together with the aluminum heat sink (for instance in a furnace).

The solder mediation layer may have a thickness of approximately 5-150 μm, such as, of 10-100 μm or 20-50 μm. The solder mediation layer is not thicker than 150 μm and, in some examples, not thicker than 100 μm, for example, thicker than 50 or 30 μm. In some examples, the solder mediation layer is applied before the aluminum sheets are connected to one another or after the aluminum sheets are connected to one another. Applying the solder mediation layer can therefore be a step which is separate from the step of interconnecting the aluminum sheets.

In some implementations, cooling channels can be provided in the heat sink, the cooling channels having a free inner cross section or turbulators being introduced in the cooling channels. The turbulators are physically independent bodies (for instance a folded sheet segment) which are connected to the inner wall of the cooling channel, or are formed by lateral cutouts, or are formed by body sections that project into the channel.

Furthermore, a method for producing a cooling device described here is set out. In the context of the method, as an exemplary way of connecting the aluminum sheets, soldering compound is applied on a connecting surface of at least one of the aluminum sheets, for instance by printing or rolling, for example, by applying or inserting a "preform" as sheet or film that forms the soldering compound (in particular the hard soldering compound within the cooling device). The aluminum sheets are stacked. In some examples, the aluminum sheets already provided with soldering compound are stacked or the aluminum sheets are stacked alternately with the soldering compound formed as a sheet or film. The soldering compound is melted in order to form at least one solder layer between the aluminum sheets. This is carried out, for example, by heating the aluminum sheets together with the soldering compound, for instance in a furnace. The furnace can be evacuated or can have a nitrogen atmosphere in the interior. As a result, the aluminum heat sink is produced as a stacked aluminum sheet structure. Flux can be used, for example, as an additive to the soldering compound.

In some implementations, the at least one solder mediation layer is applied before or after connecting the aluminum sheets, for example, before or after melting the soldering compound and, if appropriate, before or after applying the soldering compound and/or before or after stacking the aluminum sheets. If the solder mediation layer is formed as a film, in the context of the method, furthermore, this at least one film constituting the solder mediation layer can be placed onto one of the aluminum sheets, for example, onto one of the aluminum sheets which forms an outer side of the aluminum heat sink. In this case, soldering compound is situated between the solder mediation layer and the aluminum sheet. Therefore, it may be provided that solder is applied to a connecting surface of the film (i.e. of the solder mediation layer) or of the relevant aluminum sheet.

The soldering compound situated between the solder mediation layer and the aluminum sheet is melted by the same step as the soldering compound between the aluminum sheets. Therefore, the soldering compound situated between the solder mediation layer and the aluminum sheet and the soldering compound between the aluminum sheets can be heated and melted in one and the same step, for instance by the stacked aluminum sheets and the solder mediation layer (formed as a film) being introduced into a furnace that heats and thereby melts the soldering compound. A solder layer is formed between the solder mediation layer (formed as a film) and the aluminum heat sink, for example, in one and the same step of heating (for instance in a furnace).

As mentioned, connecting the aluminum sheets by soldering compound is one possibility among several. For example, adhesive bonding can also be carried out or a force-locking or positively locking connection by a clip, a screw connection or the like can be produced in order thus to interconnect the aluminum sheets.

Before stacking, at least one of the aluminum sheets may be stamped. The stamping forms the cutouts that form the cooling channel that is closed off by adjacent sheets or sheet segments. In the context of stacking, the aluminum sheet may be inserted between two aluminum sheets or, if appropriate between one of the aluminum sheets and the solder mediation layer (formed as a film). As a result of the stacking, a cooling channel is formed by the surrounding aluminum sheets. The stamping produces the cutouts which together with the adjacent components form the at least one cooling channel. In the context of stacking, furthermore, a turbulator (as an independent body) may be inserted into the cutout and/or secured there. In this case, soldering compound may be introduced between the turbulator and the adjoining aluminum sheet, such that if appropriate together with the soldering compound between the aluminum sheets and one of the aluminum sheets, the soldering compound between the turbulator and the adjoining sheet or sheet segment is also melted in order to form a solder layer. This can be combined with melting the soldering compound between the solder mediation layer if the latter is formed as a film.

In the context of the method for producing a cooling device, the aluminum sheets are stacked in order to form an aluminum heat sink. At least one of the stacked aluminum sheets has cutouts for forming a cooling channel.

The stacked aluminum sheets (20, 22, 24) are connected to one another in order to form the aluminum heat sink. The connecting process can take place for instance by producing a force-locking or positively locking connection, for example by producing a screw connection or by clamping in edges of the aluminum sheets by a clip, or by soldering the aluminum sheets. When producing a force-locking or positively locking connection, it may be provided that sealing compound such as silicone or preferably elastic sealing bodies is introduced between the aluminum sheets for the fluid-tight interconnection of the aluminum sheets. The sealing compound or the sealing bodies limit the cooling channel.

Producing a soldering connection between the aluminum sheets is therefore optional and can generally be regarded as mechanical (and fluid-tight) connection of the stacked aluminum sheets.

Furthermore, the solder mediation layer is arranged on at least one of the aluminum sheets (24), which forms an outer side of the aluminum heat sink (26). This can be performed by direct cohesive application on at least one of the aluminum sheets before or after the steps of stacking and/or connecting. Alternatively, arranging (i.e. securing or applying) the solder mediation layer may be carried out by soldering. In this case, soldering compound may be situated between the solder mediation layer and the aluminum sheet. The soldering compound situated between the solder mediation layer and the aluminum sheet may be melted by the heating. As a result, a solder layer is formed between the solder mediation layer and the aluminum heat sink.

Connecting the stacked aluminum sheets may be implemented by fitting a screw connection extending through all the aluminum sheets, or by fitting a clip engaging around edges of all the aluminum sheets. Alternatively, soldering may be carried out, where the stacked aluminum sheets are interconnected by applying soldering compound on a connecting surface of at least one aluminum sheet, for example, before the step of stacking.

It is then possible to melt the soldering compound in order to form at least one solder layer between the aluminum sheets by heating the aluminum sheets together with the soldering compound. As a result, the aluminum heat sink is produced as a stacked aluminum sheet structure.

The solder mediation layer can be arranged by soldering. Soldering compound may be situated between the solder mediation layer and the aluminum sheet, for instance by virtue of the soldering compound being applied on the aluminum sheet or on the solder mediation layer (formed as a film) (before stacking) and the solder mediation layer then being placed onto the aluminum sheet. The soldering compound is then in the green state and is positioned between solder mediation layer and aluminum sheet. The soldering compound situated between the solder mediation layer and the aluminum sheet may be melted in the step of melting that soldering compound which is situated between the aluminum sheets. By melting the soldering compound situated between the solder mediation layer and the aluminum sheet, a solder layer is formed between the solder mediation layer and the aluminum heat sink.

A soldering compound composed of hard solder is used, for example, an aluminum solder having a proportion of silicon. The soldering compound may have a melting point of at least 450° C.

In a subsequent step, by soft soldering, a circuit board or some other carrier having a copper conductive layer (or else just a copper conductive layer itself) may be soldered onto the solder mediation layer. In this case, the temperature is below the melting point of the abovementioned soldering compound.

Furthermore, a description is given of a power circuit having a cooling device—as mentioned here—including an aluminum heat sink (composed of stacked sheets) and a solder mediation layer, which power circuit furthermore includes a circuit board. The circuit board is provided with a conductor layer, for example, with a copper conductor layer, on both sides. The conductor layer and thus also the circuit board are connected to the solder mediation layer via a solder layer (preferably soft solder), for example, to the securing surface formed by the solder mediation layer. The power circuit furthermore includes at least one semiconductor or some other electrical or electronic component which is mounted on the circuit board on that side of the circuit board which faces away from the solder mediation layer (i.e. on the opposite conductor layer). The solder layer between circuit board and securing surface or between component and circuit board is composed of soft solder, for example. It is possible to use Sn-based soft solder, for example, with an Ag additive, such as, soft solder from the group SnAg3.5, alternatively with the modifications SnAg3Cu0.5 and Sn95.75Ag3.5Cu0.75.

The semiconductor may be a power semiconductor in the form of an unpackaged semiconductor. The latter is secured on the circuit board by a soft solder layer. The semiconductor (or the component) may be soldered on the circuit board in the same step in which the circuit board is also soldered onto the cooling device (or onto the aluminum heat sink or onto the securing surface/solder mediation layer) by the relevant (soft) soldering compound being heated in a furnace (together with the cooling device, the circuit board and the semiconductor/component). In the furnace here a temperature is provided which is above the melting point of the soldering compound between component and circuit board and the soldering compound between the circuit board and the heat sink, and which is below the melting point of the soldering compound or of the solder layers situated within the cooling device.

In some examples, the power circuit forms an electric motor power driving system of a vehicle, a voltage- or current-power convertor in an on-board vehicle electrical system or an invertor or rectifier circuit. The power circuit may be of polyphase, such as, three-phase, design. The term power circuit denotes circuits which have a current-carrying capacity for currents of at least 50 A, 100 A, 200 A or 500 A.

In some examples, "direct copper bonded" circuit boards are used as the circuit board, where printed circuit boards with copper cladding are also possible. In addition, the circuit boards used can be substrates in which the conductor layer is initially structured as an individual sheet, wherein individual conductor tracks or the connecting structure arise(s) as a result of stamping, for instance, and then the connecting structure is connected to the substrate, for instance by the material of the (electrically insulating) substrate being injection-molded around the connecting structure.

The details of one or more implementations of the disclosure are set forth in the accompanying drawings and the description below. Other aspects, features, and advantages will be apparent from the description and drawings, and from the claims.

DESCRIPTION OF DRAWINGS

FIG. 1 shows a power circuit and a heat sink associated with the power circuit, in cross section.

Like reference symbols in the various drawings indicate like elements.

DETAILED DESCRIPTION

FIG. 1 shows, in cross section, a cooling device 10 including a plurality of aluminum sheets 20, 22, 24 stacked one above another. The aluminum sheets (including associated elements such as solder layers, inlet, outlet, turbulators, securing elements, etc.) form an aluminum heat sink. The aluminum sheets are stacked in alignment one above another. The aluminum sheet 22 lying between the aluminum sheets 20 and 24 has cutouts 50, 52, which form a cooling channel. The cooling channel extends as far as an outer surface of the heat sink 10, for example, as far as an edge which for instance is offset with respect to the plane of the drawing (and is therefore not illustrated). An inlet and respectively an outlet can be provided, which are situated at the ends of the cooling channel.

The aluminum sheets 20-24 are connected to one another by solder layers 30 and 32, respectively, where a respective solder layer lies between two adjacent aluminum sheets. In some examples, the solder layer is situated where the aluminum sheets also abut one another, where no soldering compound either or no solder layer either may be provided at the cutouts 50, 52. Turbulators 40 can be situated within the cutouts 50, 52, the turbulators 40 being formed from corrugated sheet metal as illustrated. The turbulators 40 are connected to the adjoining aluminum sheets 20, 24 via individual solder layer sections 34. However, the turbulators 40 are optional and can also be omitted. The cutouts 50, 52 extend through the entire thickness of the intervening aluminum sheet 22. As a result, the cutouts 50, 52 equally each form a cooling channel (or cooling channel section of a common cooling channel) which is closed off by the sheets 20, 24 between which the sheet 22 having the cutouts lies.

On an outer side of the stacked aluminum sheets, for example, on a main surface of an outer aluminum sheet 20, 24 facing away from the cutouts 50, 52, a solder mediation layer 90 is situated, which is connected to the aluminum sheet 24 via an optional solder layer 36. The solder layers 30-34 and the optional solder layer 36 are hard solder layers and can be produced in a common melting process within a furnace. As mentioned, the solder layer 36 may be omitted by virtue of the solder mediation layer 90 being produced by deposition or coating methods, for instance as an electrolytic layer or as a layer applied by vapor deposition. In this case, the solder mediation layer 90 directly adjoins the aluminum sheet (or the aluminum heat sink).

The solder mediation layer 90 forms a securing surface 92 facing away from the aluminum sheets 20-24. The securing surface 92 is formed by a top side of the solder mediation layer 90 and, for example, by a surface of the solder mediation layer 90 which is provided with a solder layer 70. The solder layer 70 is composed of soft solder, for example, and serves for simpler further placement. Electronic or electrical components to be cooled can be secured to the securing surface.

FIG. 1 shows, besides the heat sink 10 according to the disclosure, a populated circuit board 60 situated on the securing surface 92. Consequently, FIG. 1 shows not only the heat sink 10 according to the disclosure but also a power circuit which includes the heat sink 10 and which furthermore forms the power circuit. The circuit board 60 is a circuit board coated on both sides, including a first conductor layer 62 and a second conductor layer 64. The first conductor layer 62 is connected to the solder mediation layer 90 via the soft solder layer 70, such that the circuit board 60 is connected to the securing surface of the heat sink 10 via the first conductor layer 62. The opposite, second conductor layer 62 serves for mounting a semiconductor 80, which is also representative of other electrical or electronic components, in particular power components.

A solder layer 72, which is formed as a soft solder layer in the same way as the layer 70, connects the semiconductor 80 to the second conductor layer 64 facing away from the heat sink 10. The semiconductor 80 is an unpackaged semiconductor, for instance a transistor, such as, but not limited to, an IGBT or a MOSFET. The semiconductor 80 represents merely by way of example a multiplicity of components which can be mounted on the circuit board 60.

For the sake of better illustration, the circuit board 60 has been shown as narrower than the nickel sheet segment in FIG. 1, where, in further examples, the circuit board can project laterally beyond the solder layer and also beyond the heat sink 10. In this case, for example, power semiconductors or power components which generate heat to be dissipated are arranged above the securing surface 92, such that the heat conducting path for the heat to be dissipated remains short.

Furthermore, the heat sink 10 may include a solder mediation layer 90 and thus a securing surface 92 not only on one side, but can also be provided with solder mediation layers on both sides. In this case, by way of example, the optional solder mediation layer 90' is illustrated, which is situated on the opposite side of the aluminum body (formed by the aluminum layers 20-24) relative to the solder mediation layer 90. The second solder mediation layer 90' includes a further securing surface 92', to which components or circuit boards may be secured in order to dissipate the heat thereof. Like the solder mediation layer 90, the solder mediation layer 90' is connected to the aluminum heat sink (i.e. to the aluminum sheets) by a hard solder layer 36'. However, this is just one possibility among many. By way of example, like the solder mediation layer 90, the solder mediation layer 90' can be directly cohesively connected to the aluminum body or to the aluminum sheets, for instance as a layer applied by electroplating or vapor deposition.

As already noted, the aluminum heat sink 10 is formed by the aluminum sheets 20, 22 and 24 and also the intervening solder layers 30 and 32, if appropriate including the turbulators 40.

Besides internal cooling channels, the aluminum heat sink can also include cooling fins, for example, on the surface of the aluminum heat sink, such that alternatively or additionally heat can be dissipated via the surface of the heat sink (and not just via the cooling channels).

A number of implementations have been described. Nevertheless, it will be understood that various modifications may be made without departing from the spirit and scope of the disclosure. Accordingly, other implementations are within the scope of the following claims.

What is claimed is:

1. A method for producing a cooling device, the method comprising:
    stacking aluminum sheets to form an aluminum heat sink, at least one of the aluminum sheets having cutouts for forming a cooling channel;
    connecting the stacked aluminum sheets to one another to form the aluminum heat sink; and
    arranging a solder mediation layer on at least one of the aluminum sheets, which forms an outer side of the aluminum heat sink, either by direct cohesive application on at least one of the aluminum sheets before or after the steps of stacking and connecting, or by soldering, wherein a soldering compound is situated between the solder mediation layer and the aluminum sheet, wherein the soldering compound situated between the solder mediation layer and the aluminum sheet is melted by the heating in order to form a solder layer between the solder mediation layer and the aluminum heat sink.

2. The method of claim 1, wherein connecting the stacked aluminum sheets comprises: fitting a screw connection extending through all the aluminum sheets, or a clip engaging around edges of all the aluminum sheets, or wherein connecting the stacked aluminum sheets comprises:
    applying a soldering compound on a connecting surface of at least one aluminum sheet before the step of stacking; and
    melting the soldering compound in order to form at least one solder layer between the aluminum sheets by heating the aluminum sheets together with the soldering compound, as a result of which the aluminum heat sink is produced as a stacked aluminum sheet structure, wherein the solder mediation layer is arranged by soldering, wherein soldering compound is situated between the solder mediation layer and the aluminum sheet, and the soldering compound situated between the solder mediation layer and the aluminum sheet is melted in the step of melting the soldering compound between the aluminum sheets in order to form a solder layer between the solder mediation layer and the aluminum heat sink.

3. The method of claim 1, wherein before stacking at least one of the aluminum sheets is stamped in order to form a cooling channel as a result of the stacking by the surrounding aluminum sheets.

4. The method of claim 1, wherein the he aluminum sheets are rolled aluminum sheets which are solderable by hard solder.

5. The method of claim 1, wherein the solder mediation layer is formed as a nickel layer and has a proportion by mass of nickel of at least 70% or 85% nickel.

6. The method of claim 1, wherein the solder mediation layer is formed as a nickel layer and has a proportion by mass of nickel of at least 95%, 98% or99% nickel.

7. The method of claim 1, wherein the solder mediation layer has a thickness of not more than 150, 100 or 50 µm.

* * * * *